United States Patent [19]

Yamamoto et al.

[11] Patent Number: 4,988,423

[45] Date of Patent: Jan. 29, 1991

[54] METHOD FOR FABRICATING INTERCONNECTION STRUCTURE

[75] Inventors: Hiroshi Yamamoto, Neyagawa; Tsutomu Fujita, Hirakata; Takao Kakiuchi, Takarazuka; Kousaku Yano, Osaka; Shuichi Tanimura; Shinji Fujii, both of Hirakata, all of Japan

[73] Assignee: Matsushita Electric Industrial Co., Ltd., Osaka, Japan

[21] Appl. No.: 430,950

[22] Filed: Nov. 3, 1989

Related U.S. Application Data

[63] Continuation of Ser. No. 176,771, Apr. 1, 1988, abandoned.

[30] Foreign Application Priority Data

Jun. 19, 1987 [JP] Japan ................................. 62-153662
Oct. 20, 1987 [JP] Japan ................................. 62-264433

[51] Int. Cl.⁵ .................... C23C 14/34; H01L 21/285
[52] U.S. Cl. ............................... 204/192.17; 437/192; 437/194; 437/241
[58] Field of Search ................... 204/192.17; 437/192, 437/194, 241

[56] References Cited

U.S. PATENT DOCUMENTS

4,517,225 5/1985 Broadbent ........................... 437/192
4,824,803 4/1989 Us et al. .............................. 437/192

FOREIGN PATENT DOCUMENTS

WO88/01102 2/1988 European Pat. Off. ............ 437/192
59-79550 5/1984 Japan .................................. 437/192

OTHER PUBLICATIONS

D. S. Gardner et al., *IEEE Transaction on Electron Devices*, vol. 32, (1985) pp. 174–181.
H. P. W. Hey et al., *Technical Digest of 1986 International Electron Device Meeting*, pp. 50–52.
K. Kamoshida et al., *Technical Digest of 1986 International Electron Device Meeting*, pp. 70–73.
Yamamoto et al., IEEE International Electron Devices Meeting, Dec. 6–9, 1987, pp. 205–208.

*Primary Examiner*—Aaron Weisstuch
*Attorney, Agent, or Firm*—Wenderoth, Lind & Ponack

[57] ABSTRACT

Disclosed is a method for fabricating an interconnection structure comprising a step of depositing an Al or Al alloy film on a dielectric film by a sputtering method improved in step coverage, a step of processing said Al or Al alloy film or a layered metal film thereof with another metal film into a metal line, and a step of depositing a film of high melting point metal or alloy thereof on the top and side surfaces of said line.

8 Claims, 6 Drawing Sheets

METHOD FOR FABRICATING INTERCONNECTION STRUCTURE

This application is a continuation of now abandoned application, Serial No. 07/176,771 filed on Apr. 1, 1988.

BACKGROUND OF THE INVENTION

This invention relates to a method for fabricating an interconnection structure used in a semiconductor device.

The interconnection structure used in the conventional semiconductor device is composed of a conductor line such as metal, polysilicon, and metal silicide, a contact for coupling this conductor line with semiconductor devices or other conductor line, and an insulator for isolating the conductor line from semiconductor devices or other conductor line and to passivate the surface. Of them, for example, the metal conductor line is generally fabricated from a film of aluminum (Al) or aluminum alloy (Al alloy). It has also been proposed to use a layered film of Al or Al alloy film with another metal, such as tungsten (W), tantalum (Ta), titanium (Ti) or other refractory metal, or an alloy of them with another substance, for example, an alloy with silicon (Si) (e.g., D.S. Gardner et al., *IEEE Transaction on Electron Devices,* Vol. 32, 1985, p.174).

It has also been proposed to fabricate a metal conductor line by laminating W films on the top and side surface of a metal line by performing chemical vapor deposition (CVD) in an atmosphere containing a W compound gas after processing the Al alloy film deposited on an insulated film into a metal line (e.g., H.P. Hey et al., *Technical Digest of 1986 International Electron Device Meeting,* p. 50).

On the other hand, the Al or Al alloy film has usually been laminated by a sputtering method. In addition, it has been proposed to use a sputtering method improved in step coverage by applying either bias potential or thermal energy or both to the substrate during at least a certain time of the deposition (e.g., K. Kamoshida et al., *Technical Digest of 1986 International Electron Device Meeting,* p. 70).

However, the interconnection structure using the metal conductor line fabricated from a film of Al or Al alloy involves the following problems, and there is a limit to its use in miniaturized semiconductor devices.

(1) A short circuit with other wiring occurs due to hillocks formed on the surface of the metal conductor line or metal film at the time of heat treatment performed in the fabricating process after the metal film deposition step.

(2) When an Al alloy film containing Si is used at least as one material, Si nodule precipitation occurs in the metal conductor line, and effective conductor sectional area decreases in this portion. If the degree of this decrease is great, the conductor resistance increases. If the decrease is not so significant, for example, reliability deteriorates due to electromigration.

(3) At the time of heat treatment applied in the manufacturing step after the metal conductor is covered with an insulating film, or at the time of storage or operation after completion, when the semiconductor device temperature reaches or exceeds 100° C., a stress induced failure occurs. That is, voids are formed in the metal conductor, and the conductor is broken or the effective conductor sectional area is decreased in that portion, and reliability deteriorates due to electromigration. Furthermore, the above-mentioned Si nodule precipitation is enhanced.

In an actual semiconductor device, moreover, an insulating film effective for preventing osmosis of moisture or other impurity which causes the characteristics of the semiconductor device to vary, such as a silicon nitride film, is often used as one of the materials for the passivation film or interlayer dielectric film, and since such film possesses a strong compressive strength, an intense tensile stress is applied to the metal conductor line so that the above problems in particular may appear.

(4) Electromigration is caused by the current flowing in the metal conductor during operation of the semiconductor, and voids are formed in the metal conductor to cause breakage of the conductor or formation of hillocks on the surface of the conductor, thereby producing a short circuit with another conductor(s).

(5) On the surface of the Al or Al alloy, an alumina layer which is chemically stable and is an electric insulator is easily formed, and therefore when an interconnection structure having two or more metal conductor layers is fabricated by using the Al or Al alloy film, it is difficult to completely remove the alumina layer at the interface of the contact part with the conductor of the next layer, and hence it is difficult to obtain an electrically favorable connection at a high yield.

Moreover, this phenomenon is a particularly serious problem in a semiconductor device having a high degree of integration due to the following reasons.

That is, in order to raise the degree of integration, it is important to planarize the surface of the interlayer dielectric film to isolate the individual conductor layers. To accomplish this, dielectric films fabricated from organic materials such as polyimide, spin-on glass (SOG), and silicon oxide deposited by chemical vapor deposition (CVD) in an atmosphere containing an organic Si compound gas such as tetraethylorthosilicate (TEOS), are often used as at least one of the materials for composing the interlayer dielectric film. However, such films have a high content of moisture or other volatile matter, and by reaction therewith the thickness of an alumina layer on the Al alloy film surface may increase, or a compound which is more difficult to be removed than alumina may be generated, which makes it difficult to obtain an electrically favorable connection between conductor lines at a high yield.

(6) The Al or Al alloy film deposited by an ordinary sputtering method is poor in step coverage, and the film thickness decreases in the stepped portion of the substrate surface, for example, in the contact holes. In particular, when the hole diameter is small and its depth is large, breakage occurs when forming a conductor line. Even if breakage does not occur when forming a conductor line, the sectional area of the metal conductor line decreases, and in such portion, when covered with a dielectric film, the mechanical stress applied on the metal conductor line becomes large. Therefore, said stress induced failure or electromigration may be easily generated in such area, which lowers reliability.

Of these problems, points (3) and (4) may be solved by using a laminated film of Al or Al alloy film with another metal film. But it will not be an effective solution for the other problems. Concerning the first problem, for example, although generation of hillocks on the surface of the metal film or metal conductor may be inhibited, generation of hillocks on the side surface is encouraged. Besides, as compared with a metal conductor line fabricated from an Al or Al alloy film having the same size, the resistance is higher, and this resistance is further increased by heat treatment in the manufacturing step after formation of the metal conductor line.

On the other hand, in the case of the abovesaid method of fabricating a metal conductor line by depositing a W film on the top and side surfaces of the line by CVD in an atmosphere containing a W compound gas after processing the Al alloy film depositing on the dielectric film into a metal line, problems (1), (2) and (4) may be solved.

However, as for problem (6), for example, it is not so effective. Hey et al. deposited an Al alloy film by an ordinary sputtering method in a contact hole with a tapered side 1.25 μm in diameter, processed it into a line, deposited a W film, and proved that, in this structure, the step coverage of metal wiring at the side wall was improved, but in this case, too, the film thickness of the Al alloy at the side wall is far decreased as compared with that of the flat part, and there is a high possibility of electromigration or a lowering of the reliability to stress migration. Also, when the contact hole diameter is smaller or when the side wall is formed vertically, the possibility of occurrence of defects in the conductor line fabrication process becomes higher. In this case, breakage occurs at the side wall when fabricating an Al alloy line, and since the W film deposits only on the surface of the Al alloy line, it is impossible to repair the breakage occurring in the line even by a W film deposition.

Whether this method is effective for problem (3) has not yet been discussed. Further, Hey et al. only employed a silicon oxide film which is supposed to have a very slight stress as an interlayer dielectric film, and did not report the effect of using a dielectric film having a strong compressive stress.

Relating to problem (5), this method is exemplified by depositing a W film in a contact hole by using a silicon oxide film as an interlayer dielectric film, but nothing has been reported about the case in which a W film is not deposited in the contact hole, or when an organic dielectric film such as polyimide, SOG film, or silicon oxide film or other dielectric film fabricated by CVD in an atmosphere containing an organic Si compound gas is used at least as one of the materials for the interlayer dielectric film.

Problem (6) may possibly be solved by depositing an Al or Al alloy film by a sputtering method improved in step coverage by applying either bias potential or heat energy, or both, to the substrate at least during a certain time of the deposition process. However, when the conductor line is fabricated by using such Al or Al alloy film, the stress induced failure of the metal conductor and lowering of reliability due to electromigration are newly found problems as compared with the metal conductor made from a film deposited by the conventional sputtering method. Even if these problems were solved, it would be difficult to apply this method when forming second and subsequent metal conductor lines in the interconnection structure with two or more metal conductor layers. This is because defects may occur in the metal conductor substratum when depositing the Al or Al alloy film used for fabricating the second and subsequent Al alloy films by the sputtering method improved in step coverage to the tapered portion of the substrate surface.

SUMMARY OF THE INVENTION

It is hence a primary object of this invention to present a method for fabricating an interconnection structure which can solve the above-discussed problems and can be used in a miniaturized semiconductor device.

In order to achieve this object, the method for fabricating an interconnection structure of this invention comprises a step of depositing an Al or Al alloy film on a dielectric film by a sputtering method improved in step coverage by applying either bias potential or heat energy, or both, to the substrate at least during a certain time in the deposition process, a step of processing said Al or Al alloy film or a layered metal film thereof with another metal film into a metal line, and a step of depositing a high melting point metal or an alloy film mainly composed thereof on the top and side surfaces of said line.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

(Embodiment 1)

Figure 1A:
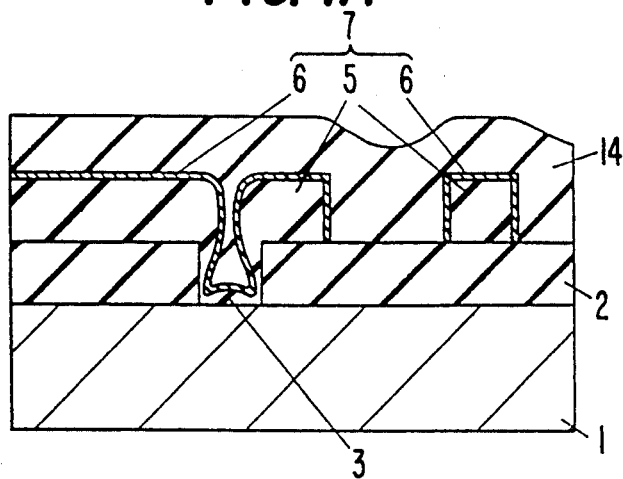
FIG. 1A and FIG. 1B are sectional views showing first and second examples of a semiconductor device in which an interconnection structure is fabricated according to the method of this invention.
Figure 1B:
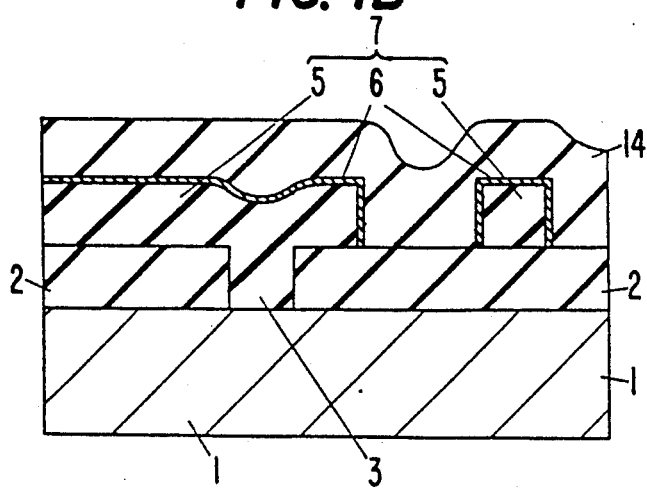

FIG. 1A and FIG. 1B are sectional views showing first and second examples of a semiconductor device in which an interconnection structure is fabricated according to the method of this invention. In the illustrated examples, a metal conductor line 7 is formed by encapsulating the top and side surfaces of an Al alloy line 5 with a W film 6. FIG. 1A is an example of an ordinary sputtering method for deposition of an Al alloy film, whereas FIG. 1B denotes an example of a sputtering method improved in step coverage, for example, a bias sputtering method for applying a negative bias potential to the substrate when depositing.

In FIG. 1A, an underlying dielectric film 2 is formed on a silicon (Si) wafer 1, and a contact hole 3 is formed in this film 2. An Al alloy line 5 is formed on the underlying dielectric film 2 and in the contact hole 3, and the surface of this line 5 is encapsulated with a W film 6. The Al alloy line 5 encapsulated with the W film 6 forms a first layer metal conductor line 7, which is encapsulated with a passivation film 14.

The structure in FIG. 1B is similar to that in FIG. 1A, except that the W film 6 is not invading the contact hole 3.

The materials of the underlying dielectric film 2 may include, for example, silicon oxide, silicon nitride, silicon oxynitride, silicon oxide containing dopants such as phosphorus and boron, and a layered dielectric film obtained by combining them. The materials of the passivation film 14 may be, for example, silicon oxide, silicon nitride, silicon oxynitride, silicon oxide containing dopants such as phosphorus and boron, polyimide or other organic dielectric, or a layered dielectric film obtained by combining them. The W film 6 is deposited by, for example, a sputtering method or a CVD method. Though omitted in the drawings, the semiconductor element parts necessary for the semiconductor device except for the internal wiring of the structure have been already formed in the silicon waver 1.

In the metal conductor line used in this embodiment, the lowering of reliability is small because of the following reasons.

(1) Movement of Al atoms on the surface of the Al alloy line 5 is restricted by the existence of the W film 6, and generation of hillocks is inhibited.

(2) Because of the encapsulation with the W film 6 which is high in mechanical strength, the stress applied on the Al alloy line 5 is smaller than the case without the W film 6, so that generation of stress induced failure may be inhibited.

(3) Movement of Al atoms on the surface of the Al alloy line 5 is restricted by the existence of the W film 6, and thus electromigration is inhibited.

(4) If voids or Si nodules should be formed in the Al alloy line 5, since electrical conduction in these areas is maintainable by the W film 6, occurrence of open circuits or increase of resistance may be prevented.

Figure 2:
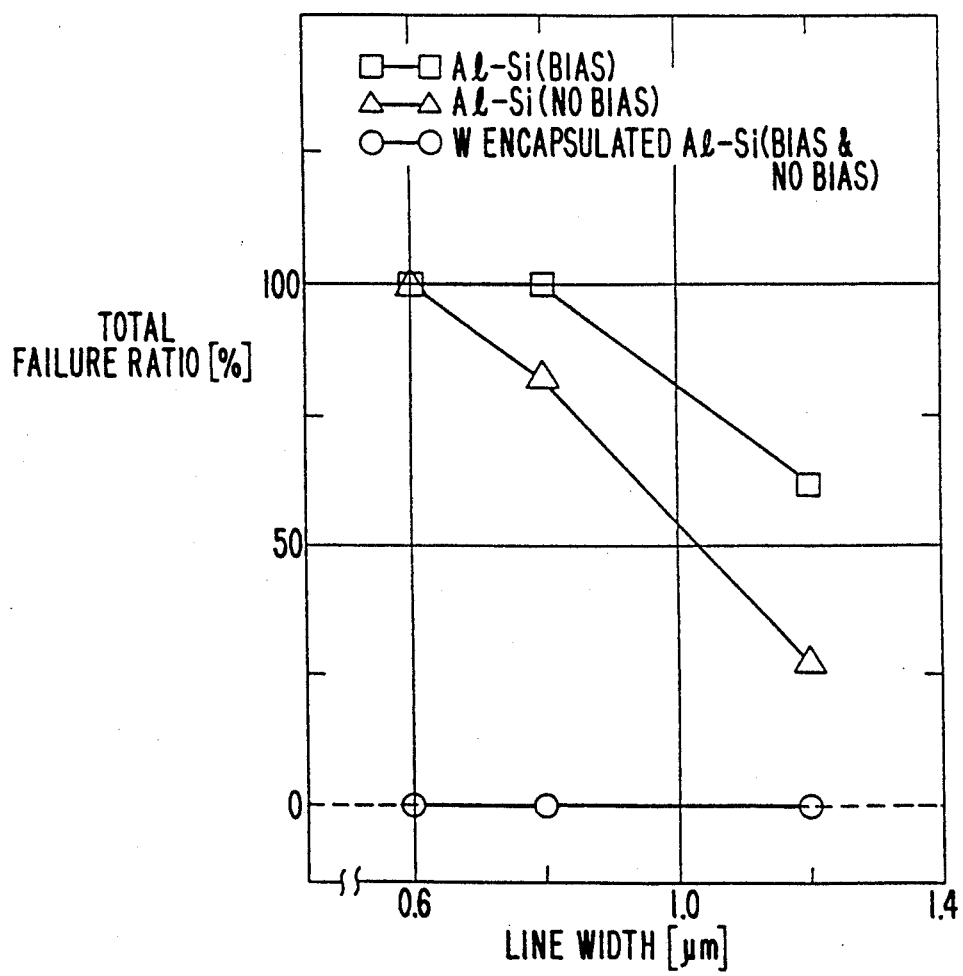
FIG. 2 shows the incidence rate of stress induced failures in the metal conductor line made of a metal line fabricated by using an Al alloy film deposited by an ordinary sputtering method and a bias sputtering method, and encapsulated with a W film, and a conventional metal conductor line not encapsulated with a W film.

FIG. 2 shows the incidence rate of stress induced failures occurring after heat treatment for 30 minutes at 450° C. and 490 hours at 150° C., in the metal conductor line encapsulated with a 100 μm thick W film made from a metal line fabricated by using a 0.5 μm thick Al-Si alloy film deposited on a flat substrate by using an ordinary sputtering method and a bias sputtering method, and a conventional metal conductor line without W film encapsulation. The passivation film is a silicon nitride film having a compressive stress of about $3 \times 10^9$ dyne/cm$^2$.

The following points are derived from FIG. 2.

(1) The failure ratio of the conductor lines not encapsulated with W film is very high;

(2) The ratio becomes higher when the line width is narrower;

(3) As compared with the deposition of an Al—Si alloy film by the ordinary sputtering method, the failure ratio becomes much higher when deposited by the bias sputtering method; and (4) The conductor line encapsulated with a W film is extremely low in failure ratio, even when the line width is narrowed to 0.6 μm, regardless of whether the Al—Si alloy film is deposited by the ordinary sputtering method or by the bias sputtering method.

From these findings it is evident that the use of a metal conductor line encapsulated with a W film is extremely effective in a miniaturized semiconductor device.

Incidentally, this effect of the W film is particularly notable when using a film having a compressive stress of more than $1 \times 10^9$ dyne/cm$^2$ as at least one of the materials for composing the passivation film or interlayer dielectric film.

For example, when a silicon oxide film having a stress of less than $1 \times 10^9$ dyne/cm$^2$ is used, although there is no difference in the tendencies of (2) and (3), the failure ratio is less than 10% even at a line width of 0.6 μm, when depositing the Al—Si alloy film by the bias sputtering method without encapsulating with a W film.

FIG. 2 shows the results of an investigation into the reliability of a conductor line formed on a flat substrate, but in the actual semiconductor device, the metal conductor line is often formed in a stepped part of the substrate surface, such as the contact hole 3 in FIG. 1.

In such a case, if the Al alloy film is deposited by the ordinary sputtering method as shown in FIG. 1A, step coverage is improper, and the deposition film thickness decreases in that portion. As a result, when processing the Al alloy film into a metal line, breakage may occur, or if not reaching the state of breakage, the sectional area of the metal conductor line in this portion becomes very small, which may easily give rise to undesired phenomena such as stress induced failure and electromigration. One of the means for solving this problem is, of course, encapsulation with a W film. It is often desired to deposit the Al alloy film by the sputtering method improved in step coverage as shown in FIG. 1B. In this case, the decrease of film thickness in the contact hole becomes smaller, and a breakage or notable decrease in the sectional area of conductor line at the time of formation of conductor line will be rarely experienced. However, as shown in FIG. 2, the reliability of the conductor line fabricated by such an Al alloy film is poor as compared with the case of using the Al alloy film deposited by the ordinary sputtering method. It is therefore extremely effective to form an interconnection structure by using a metal conductor line encapsulated with a W film made from a metal line fabricated by using an Al alloy film deposited by the sputtering method improved in step coverage.

(Embodiment 2)

Figure 3:
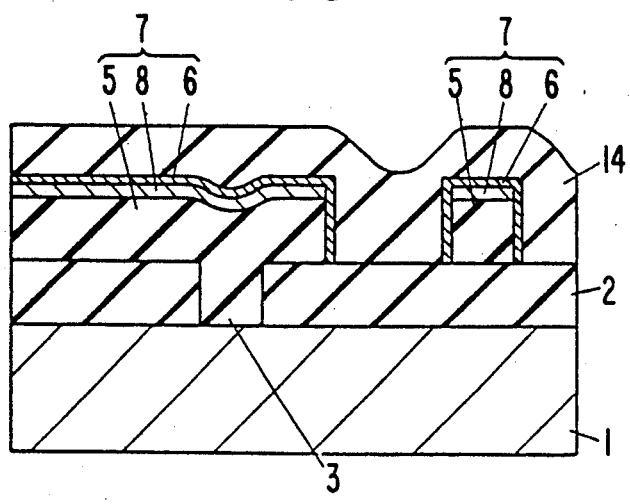
FIG. 3 and FIG. 4 are sectional views of third and fourth examples of a semiconductor device in which an interconnection structure is fabricated according to the method of this invention.

FIG. 3 is a sectional view showing a third example of a semiconductor device in which an interconnection structure is fabricated according to the method of this invention. In FIG. 3, the same parts as in FIGS. 1A, 1B are identified with the same reference numbers and are not particularly explained herein. In this example, a Ta film 8 of 20 to 100 nm in thickness is deposited on an Al alloy line 5 deposited by the sputtering method improved in step coverage, and the top and side surfaces of the dual layer laminate are encapsulated with a W film 6 to obtain a metal conductor line 7. By employing the structure of this example, it is possible to further enhance the reliability of the metal film interconnection as compared with the case in FIG. 1.

Meanwhile, similar effects are obtained by using, instead of the Ta film 8, other metal films with high melting points or their alloys, such as Ta silicide. In this example, one layer of an Al alloy film is deposited by the sputtering method improved in step coverage, and another layer of high melting point metal film is deposited thereon, but it is possible to deposit the layers in reverse order or to deposit multiple layers. In particular, when depositing two or more layers of an Al alloy thin film, all of them may be deposited by the sputtering method improved in step coverage, or part of them may be deposited by the improved sputtering method while the rest may be deposited by the ordinary sputtering method.

In FIG. 1 and FIG. 3, only metal lines fabricated by using an Al alloy film are shown, but it is also possible to use an Al film. On the other hand, as to the method of depositing the Al alloy film, only examples of using the bias sputtering method are shown, but it is also possible to employ other methods, such as the CVD method. Moreover, as for the materials for encapsulating the metal line, other metals with high melting points such as Ta and Ti may also be used, and their alloys such as Ta silicide may be similarly used.

Further, in FIG. 1 and FIG. 3, only examples of using the interconnection structure of this invention in the semiconductor device in which semiconductor elements are fabricated in the Si wafer are disclosed, but it is also possible to use, for example, devices having semiconductor elements fabricated in GaAs wafers or semiconductor films formed on a glass surface, or other devices.

(Embodiment 3)

Figure 4:
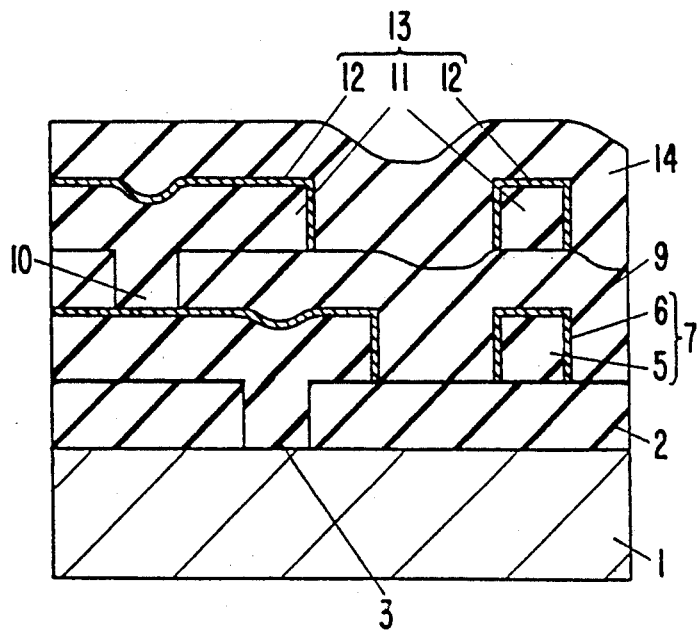

FIG. 4 is a sectional view showing a fourth example of a semiconductor device in which an interconnection structure is fabricated according to the method of this invention. In this example, there are two metal conductor line layers 7, 13, and both layers are formed with Al alloy films deposited by the sputtering method improved in step coverage. These films are processed into lines 5, 11, and they are encapsulated with W films 6, 12 to obtain a metal conductor line, from which an interconnection structure is fabricated in the semiconductor device. Materials for an interlayer dielectric film 9 may include, for example, silicon oxide, silicon nitride, silicon oxynitride, silicon oxide containing dopants such as phosphorus and boron, organic dielectric such as polyimide, SOG, and layered dielectric films obtained by combining the mentioned materials.

In this case, as in FIG. 1 and FIG. 3, it is possible to enhance the reliability of the metal conductor line by encapsulating it with a W film. Moreover, the interconnection structure of this invention is also effective in the following points.

(1) Since the top surface of the first layer metal conductor line 7 is encapsulated with the W film 6, the film thickness of the oxidized metal layer remaining at the interface with the second layer metal conductor line 13 can be decreased, and the electrical contact of the two metal conductor lines can be favorably achieved.

(2) Since the top surface of the first layer metal conductor line 7 is encapsulated with the W film 6, the degree of degradation of the first conductor line 7 and the interface between the first conductor line 7 and the second conductor line 13 due to, for example, heating is small. Accordingly, it is possible to deposit the Al alloy film used for fabricating the second layer metal conductor line 13 by the sputtering method improved in step coverage, and enhance the reliability of the interconnection in that portion.

(3) Since the top surface of the first layer metal conductor line 7 is encapsulated with the W film 6, even when dielectric films fabricated from organic materials such as polyimide, SOG, and silicon oxide deposited by performing CVD in an atmosphere containing an organic Si compound gas such as TEOS, are used as the materials of the interlayer dielectric film 9, the electrical contact between the two metal conductor line layers can be achieved easily. It is hence possible to restrict the formation of a thick alumina layer on the surface of the first layer metal conductor line due to moisture released from the interlayer dielectric film, and to decrease the moisture in the interlayer film by heating before depositing the Al alloy or other metal film for forming the second layer metal conductor line.

In order to study the effect of point (2), substrates were fabricated by forming, as an interlayer dielectric film, a 0.8 $\mu$m thick CVD silicon oxide film on first layer metal conductor lines made from Al—Si alloy encapsulated with a 100 nm thick W film, other conductor lines not being encapsulated, and forming contact holes in the interlayer film. They were heated to 400° C. in order to improve the step coverage by applying heat energy, and then 1 $\mu$m thick Al—Si alloy films were deposited.

Figure 5:
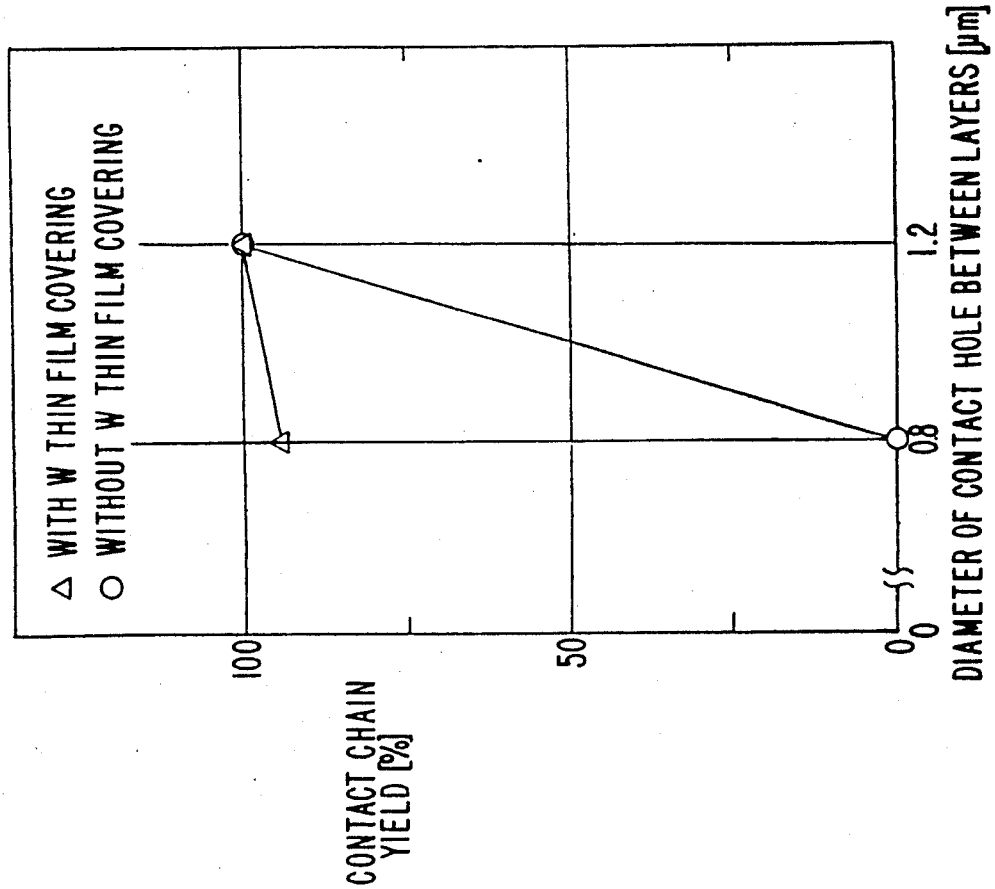
FIG. 5 shows the yield of the interlayer contact between the first layer metal conductor line and the second layer metal conductor line in the interconnection structure using a CVD silicon oxide interlayer dielectric film, the first layer metal conductor line being encapsulated with a W film and in the other case not encapsulated.

FIG. 5 shows the result of investigation of the yield of the interlayer contact between the first layer metal conductor line and the second layer metal conductor line. This yield was deduced by the percentage of the contact chains in series connection with a resistance of less than 10k$\Omega$ out of 10,000 interlayer contacts.

From FIG. 5 it is evident that the encapsulation with W film is effective for point (2), since the yield is scarcely reduced when encapsulated while the yield dropped suddenly from almost 100% to nearly 0%, if not encapsulated with W film, when the contact hole diameter is reduced from 1.2 $\mu$m to 0.8 $\mu$m. Such reduction of the yield in the non-encapsulated case was found to be due to the existence of Si nodules at the interface between the first layer conductor line 7 and the second layer conductor line 13 precipitated during the heating before the deposition of the second layer metal film.

Figure 6:
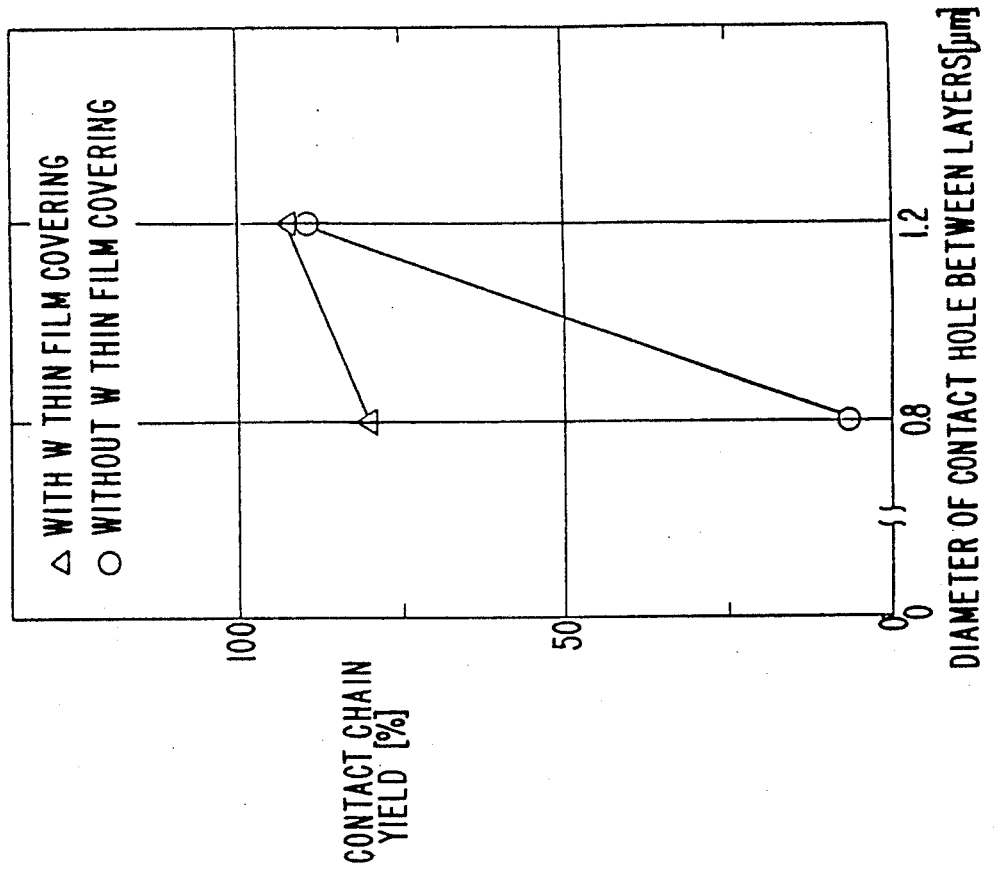
FIG. 6 shown the yield of the interlayer contact between the first layer metal conductor line and the second layer metal conductor line in the interconnection structure using an interlayer dielectric film in a layered structure of a CVD silicon oxide film and SOG, the first layer metal conductor line being encapsulated with a W film and in the other case not encapsulated.
Figure 7:
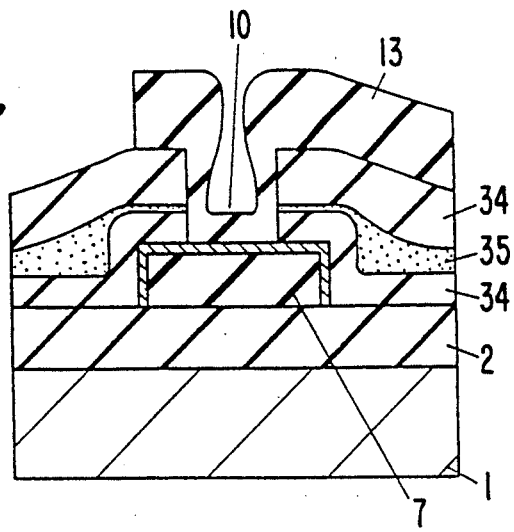
FIG. 7 is a sectional view showing the structure of an interlayer contact which has been studied.

FIG. 6 shows the result of investigation of the yield of the interlayer contact between the first layer metal conductor line and the second layer metal conductor line in the interconnection structure using an interlayer dielectric film in the form of a layered structure of CVD silicon oxide film and SOG film, comparing the first layer metal conductor line 7 encapsulated with a 100 nm thick W film and the non-encapsulated case. This yield was deduced by the percentage of the contact chains in series connection having the structure shown in FIG. 7 and a resistance less than 10kΩ out of 10,000 interlayer contacts. The film thickness of the interlayer dielectric film 9 in the flat part was 650 nm. The interlayer dielectric film 9 is composed of CVD silicon oxide film 34 and SOG 35.

From FIG. 6 it is evident that the encapsulation with W film is effective for point (3), since the reduction of yield is small when encapsulated while the yield dropped suddenly from about 80% to less than 10% if not encapsulated with W film, when the contact hole diameter is reduced from 1.2 μm to 0.8 μm.

Incidentally, in FIG. 4, two layers of metal conductor were formed and both were encapsulated with W film to prepare a metal conductor line, but, needless to say, the metal conductor line encapsulated with W film may also be used when three or more metal conductor line layers are formed. Or when forming two or more metal conductor line layers, the metal conductor line encapsulated with W film may be used either in all or part of the layers.

(Embodiment 4)

FIG. 8 shows an example of the process for fabricating a semiconductor device of the structure shown in FIG. 1B according to the method of this invention. First, on a silicon wafer 1 finished with respect to fabrication of a structure necessary as a semiconductor device except for the wiring, an underlYing dielectric film 2 is formed, and a contact hole 3 is opened in a necessary position of the substrate (FIG. 8A), on which an Al alloy film 4 is deposited in a thickness of 0.5 to 1 μm by a sputtering method (FIG. 8B). At this time, for example, by establishing a negative bias potential on the substrate side, the step coverage is improved. Also, by heating the substrate to a temperature of about 450° C. when depositing, the step coverage is further improved. Incidentally, in the portion of about 100 to 300 nm near the interface with the substrate, it is possible to deposit without applying bias, and to deposit only the subsequent portion by applying bias.

Figure 8A:
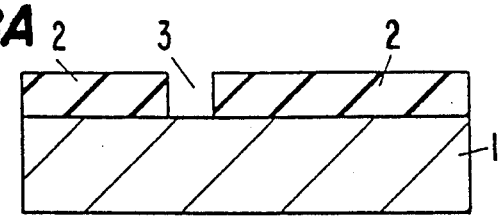
FIG. 8 is a sectional view showing an example of the process for fabricating the semiconductor device of the structure as shown in FIG. 1B.
Figure 8B:
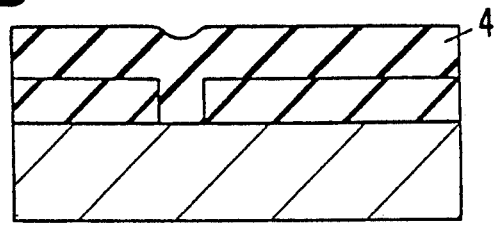
Figure 8C:
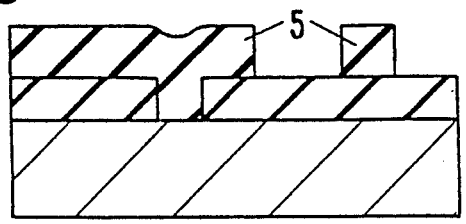
Figure 8D:
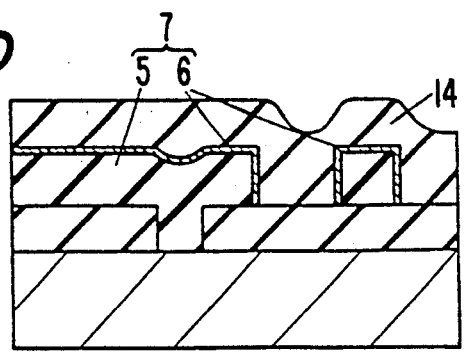

In succession, after forming a resist pattern, for example, by performing dry etching, the Al alloy film 4 may be processed into the shape of Al alloy line 5 (FIG. 8C). Next, for example, by performing CVD in an ambient containing tungsten hexafluoride (WF$_6$) and hydrogen, a W film 6 of 20 to 100 nm in thickness is selectively deposited only on the top and side surfaces of the Al alloy line 5, thereby forming a metal conductor line 7.

Afterwards, by heat treatment at, for example, 350 to 500° C., the interface of the semiconductor and metal conductor line in the part of the contact hole 3 is stabilized, and damages introduced into the semiconductor elements in the manufacturing process are eliminated, and the characteristics are inspected if necessary.

Finally, as the passivation film 14, for example, plasma CVD silicon nitride film is deposited (FIG. 8D), and the passivation film and W film are removed from the position of the bonding pad, and heat treatment is carried out again at a temperature of 350 to 500° C.

Of the manufacturing processes shown in FIG. 8, the W film depositing step is conducted by using the apparatus as shown in, for example, FIG. 9.

Figure 9A:
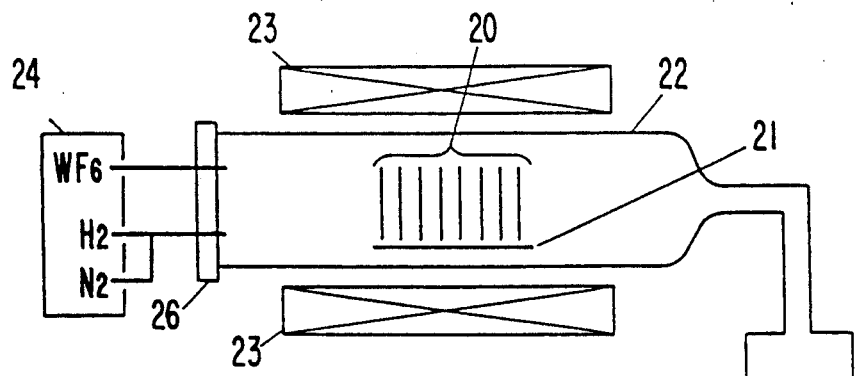
FIG. 9A and 9B show two examples of the constitution of the apparatus for executing the W film depositing step in the manufacturing process shown in FIG. 8.

FIG. 9A shows a hot wall reduced pressure CVD apparatus having a quartz reaction tube 22.

In this case, the semiconductor substrate 20 in the state shown in FIG. 8C is placed at the indicated position, and purging and vacuum pumping are conducted by using reducing gas. Then, after heating the substrate to about 300° C., WF$_6$ and H$_2$ gases are passed in to deposit the W film, and the substrate is cooled to a temperature so that the oxidation of the W film surface by the oxygen in the atmosphere may not be accelerated, and it is removed. In FIG. 9A, numeral 21 is a quartz boat, 22 is a reaction tube, 23 is a heater unit, 24 is a gas feeding unit, 25 is a vacuum pumping unit, and 26 is an inlet flange.

Figure 9B:
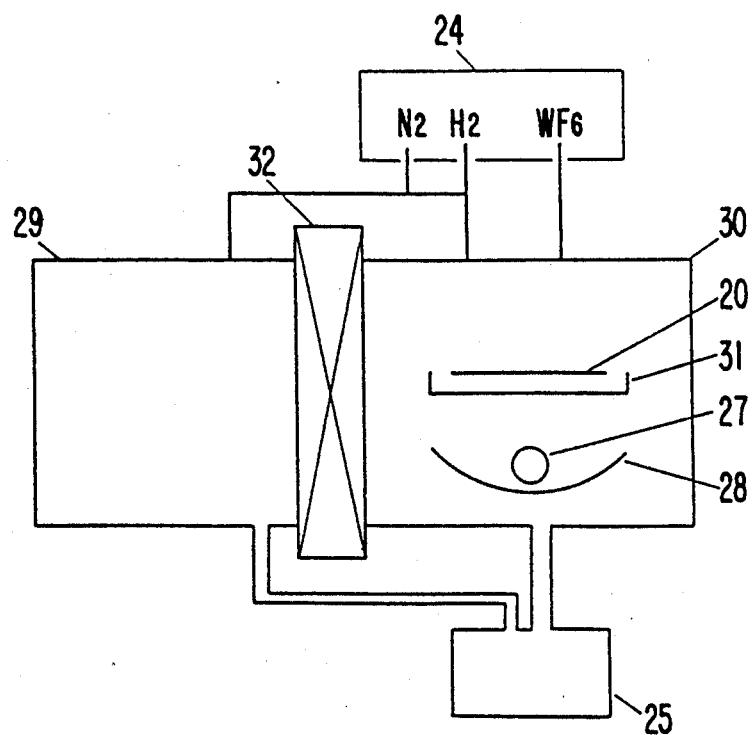

FIG. 9B shows a cold wall reduced pressure CVD apparatus using a metal chamber as a reaction chamber 30. In FIG. 9B, number 27 is an infrared lamp, 28 is a reflector, 29 is a load-lock chamber, 30 is a reaction chamber, 31 is a substrate holder, and 32 is a vacuum valve.

In this case, after setting the semiconductor substrate 20 in the reaction chamber 30 through the load-lock chamber 29, the substrate is heated to about 400° C. while performing vacuum pumping, and the W film is deposited by passing WF$_6$ and H$_2$ gases. AFterwards, the substrate is returned to the load-lock chamber 29, and cooled to a temperature so that oxidation of the W film surface may not be encouraged by the oxygen in the atmosphere, and it is removed.

In this example, meanwhile, the Al alloy film is encapsulated with the W film deposited by another method such as the sputtering method, it is hard to deposit the W film selectively on the top and side surfaces of the Al alloy line, and it is necessary to add one step of photolithography in order to remove the W film deposited on the undesired positions. Therefore, from the viewpoint of fabricating the semiconductor device of this invention by using a simpler process, it is desirable to employ the CVD method as the depositing step of the W film.

Shown in this example is the case of encapsulation with a W film deposited by using a reaction gas system containing WF$_6$ and H$_2$, but, for example, it is also possible to encapsulate by using a W film deposited by using another reaction gas system, such as tungsten hexachloride and H$_2$, WF$_6$ and silane, etc., or it is possible also to encapsulate with a film of another high melting point metal or its compound by using a reaction gas system containing another metal compound gas.

Figure 10:
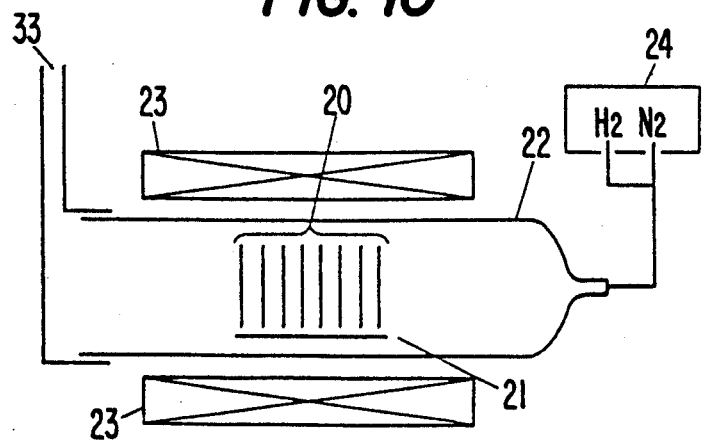
FIG. 10 shows an example of the constitution of the apparatus for heat treatment step after deposition of the W film.
Figure 11A:
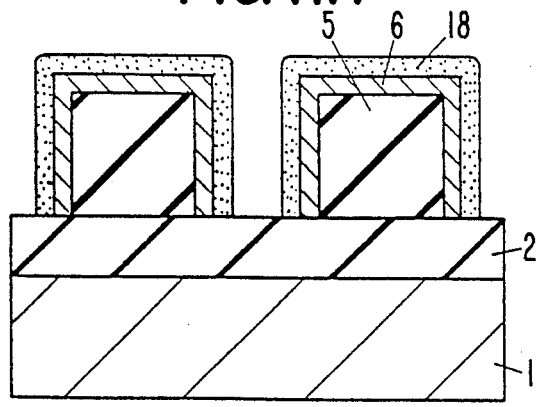
FIG. 11 is a sectional view showing the oxide film forming state on the W film surface in the metal conductor lines fabricated by a method of heating in the CVD apparatus after the W film deposition, and a method of heating by placing in a furnace as shown in FIG. 10 the semiconductor substrate after the W film deposition and exposing it to the atmospheric ambient.

The heat treatment immediately after formation of the metal conductor line 7 may be performed by using a furnace as shown in FIG. 10, for example, after depositing the W film, taking out the semiconductor substrate from the deposition apparatus, and exposing it to the atmospheric ambient. In FIG. 10, number 33 is a scavenger. In this case, however, as shown in FIG. 11A, a tungsten oxide film 18 was formed on the surface of the W film in this heat treatment step. Accordingly, the film thickness of the metal W layer 6 decreased, and the effect to enhance the reliability of the metal conductor line was lowered. This is because, in the furnace employed in the usual semiconductor manufacturing process, the residual oxygen concentration in the heat treatment ambient is high, and the substrate temperature is raised before the moisture on the substrate surface is completely removed.

Figure 11B:
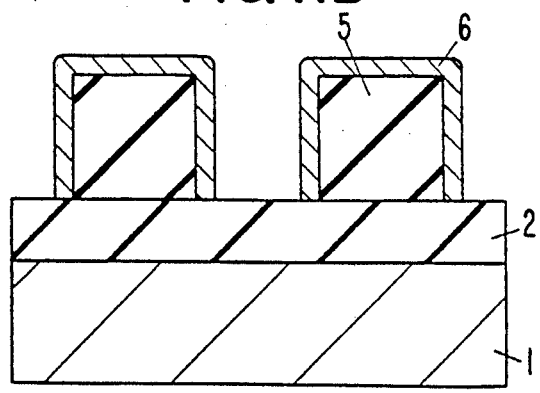

To solve this problem, it was effective to apply the heat treatment immediately after depositing the W film in the CVD apparatus without taking out the substrate into the atmosphere. Practically, for example when the apparatus shown in FIG. 9A is used in the deposition of a W film, after depositing the W film by passing $WF_6$ and $H_2$ gases, and discharging the reaction gas, or after further introducing reducing gas such as $H_2$ and $N_2$ and reducing the pressure or setting it to atmospheric pressure, the temperature is raised to a desired point, and the heat treatment is carried out. In this case, in the step of purging and vacuum pumping by reducing gas effected before deposition of the W film, the residual oxygen quantity in the reaction chamber 22 and the quantity of moisture adsorbed on the surface of the semiconductor substrate 20 are extremely small. Also, heating of the substrate for deposition of the W film is effective for decreasing the quantity of moisture adsorbed. Accordingly, the residual oxygen concentration in the atmosphere when heating, and the quantity of adsorbed moisture on the substrate surface are extremely decreased, and the oxidation of the W film surface hardly occurs. As a result, as shown in FIG. 11B, the thickness of the WOx film 18 on the surface of the W film after heat treatment can be largely reduced as compared with the case of FIG. 11A.

Figure 12:
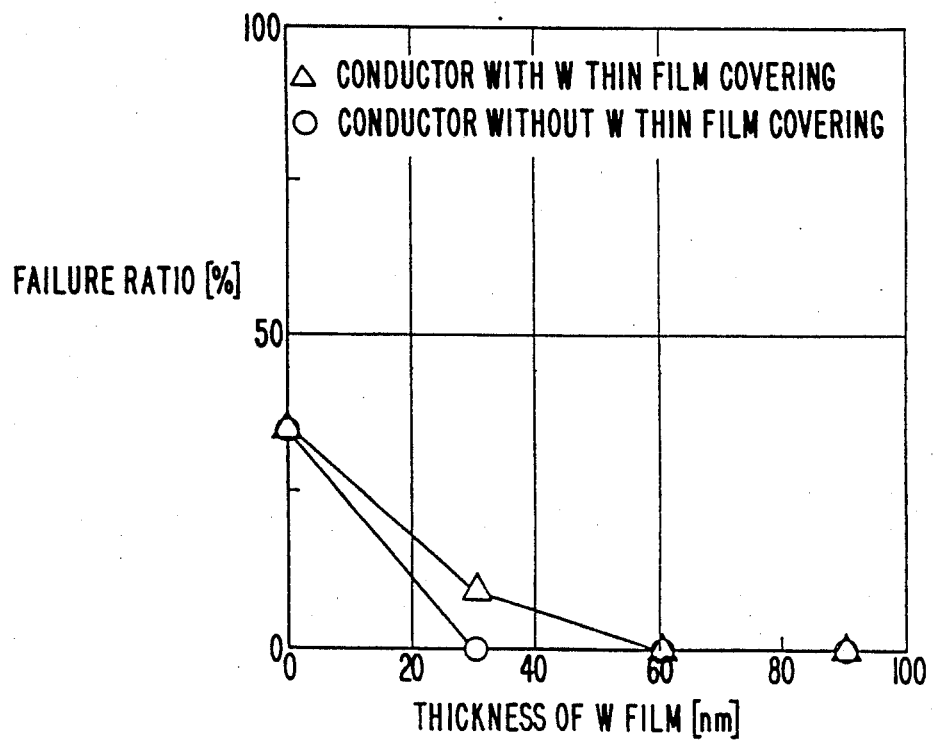
FIG. 12 shows an example of the result of an investigation into the reliability of the metal conductor lines fabricated by a method of heating in the CVD apparatus after a W film deposition, and by a method of heating in the furnace as shown in FIG. 10 the semiconductor substrate after the W film deposition and exposing it to the atmospheric ambient.

FIG. 12 shows an example of the result of investigation of reliability of the metal conductor line fabricated by heat treatment in a furnace as shown in FIG. 10 after depositing the W film, removing the semiconductor substrate and exposing it to the atmospheric ambient, as well as heat treatment in the CVD apparatus after deposition of the W film. That is, in this example, the Al—Si alloy line of 0.5 μm in film thickness and 0.6 μm in width fabricated on a flat substrate is encapsulated with the W film, and heat treatment for 30 minutes at 450° C. is conducted according to the two methods described above, the passivation film made of plasma nitride film is deposited and the bonding pad is formed, and another heat treatment is conducted for 15 minutes at 430° C. to obtain a metal conductor line, in which the relation between the failure ratio and the W film thickness after heat treatment for 1,000 hours at 150° C. is shown. It is seen that a notable reliability enhancing effect is obtained at a W film thickness of 30 nm or more for a metal conductor line fabricated by the method of performing heat treatment in the CVD apparatus, whereas a W film thickness of over 60 nm is required in order to obtain the same effect in the metal conductor line fabricated by heating after exposing to the atmospheric ambient. It is therefore possible to reduce the W film thickness necessary for obtaining a metal conductor line having a high reliability by 30 nm, by heating without exposing the substrate to the atmospheric ambient after depositing the W film in the CVD apparatus. When the width of the metal line is adjusted to a constant level by this, the distance between conductor lines can be extended by 60 nm, while the pitch of conductors is shortened by 60 nm, so that the interconnection structure of this invention may be used in a smaller semiconductor device.

Meanwhile, the process of vacuum pumping and introduction of reducing gas required before starting the heat treatment after deposition of the W film is also executed in the case of removing the substrate after deposition without heat treatment, and it does not lower the throughput. To the contrary, by employing the method of this invention, some of the jobs conducted between the W film deposition step and the heat treatment step may be omitted, and the productivity can be enhanced.

While specific embodiments of the invention have been illustrated and described herein, it is realized that other modifications and changes will occur to those skilled in the art. It is therefore understood that the appended claims are intended to cover all modifications and changes that fall within the true spirit and scope of the invention.

We claim:

1. A method of fabricating an interconnection structure which has an osmosis preventing passivation film and a metal conductor line, said metal conductor line having a low rate of disconnection failure caused by mechanical stress applied by said osmosis preventing passivation film, comprising:
   depositing an Al film or an Al alloy film or a layered metal film thereof with another metal film on a dielectric film on a substrate;
   processing said Al film or Al alloy film or layered metal film thereof with another metal film into a metal line;
   fabricating a metal conductor line by depositing a film of high melting point metal or alloy thereof on the top and side surfaces of said metal line; and
   forming on said metal conductor line an osmosis preventing passivation film comprising silicon nitride,
   wherein at least a part of said metal conductor line has a width of no greater than 1 μm.

2. A method of fabricating an interconnection structure according to claim 1,
   wherein said film of high melting point metal or alloy is deposited on the top and side surfaces of said metal line by CVD in an atmosphere containing a high melting point metal compound gas.

3. A method of fabricating an interconnection structure according to claim 2,
   further comprising a step of heating said substrate at a temperature of 350 to 550° C. after said film of high melting point metal or alloy is deposited on said metal line.

4. A method of fabricating an interconnection structure which has an osmosis preventing passivation film and a metal conductor line, said metal conductor line having a low rate of disconnection failure caused by mechanical stress applied by said osmosis preventing passivation film, comprising:
   forming a contact hole in a dielectric film on a substrate;
   depositing an Al film or Al alloy film or a layered metal film thereof with another metal film on said dielectric film by a sputtering method improved in step coverage by applying at least one of bias potential and heat energy to said substrate, at least for a certain time during deposition;
   processing said Al film or Al alloy film or layered metal film thereof with another metal film into a metal line;

fabricating a metal conductor line by depositing a film of high melting point metal or alloy thereof on the top and side surfaces of said metal line; and forming on said metal conductor line an osmosis preventing passivation film comprising silicon nitride, wherein at least a part of said metal conductor line has a width of no greater than 1 μm.

5. A method of fabricating an interconnection structure which has an osmosis preventing passivation film and metal conductor lines, said metal conductor lines having a low rate of disconnection failure caused by mechanical stress applied by said osmosis preventing passivation film, comprising:

forming a contact hole in a dielectric film on a substrate, said substrate having at least one layer of metal conductor lines fabricated thereon;

depositing an Al film or Al alloy film or a layered metal film thereof with another metal film on said dielectric film by a sputtering method;

processing said Al film or Al alloy film or layered metal film thereof into a metal line;

fabricating a further metal conductor line by depositing a film of high melting point metal or alloy thereof on the top and side surfaces of said metal line; and, forming on said further metal conductor line a passivation film comprising silicon nitride, wherein at least a part of said further metal conductor line has a width of no greater than 1 μm.

6. A method of fabricating an interconnection structure which has an osmosis preventing passivation film and metal conductor lines, said metal conductor lines having a low rate of disconnection failure caused by mechanical stress applied by said osmosis preventing passivation film, comprising:

depositing a first Al film or Al alloy film or a layered metal film thereof with another metal film on a first dielectric film on a substrate;

processing said first Al film or Al alloy film or layered metal film thereof with another metal film into a first metal line;

fabricating a first metal conductor line by depositing a film of high melting point metal or alloy thereof on the top and side surfaces of said first metal line;

forming an interlayer dielectric film on said first metal conductor line;

forming a contact hole in said interlayer dielectric film;

depositing a second Al film or Al alloy film or layered metal film thereof with another metal film on said interlayer dielectric film by a sputtering method improved in step coverage by applying at least one of bias potential and heat at a temperature higher than 350° C. to said substrate, at least for a certain time during deposition;

processing said second Al film or Al alloy film or layered metal film thereof into a second metal conductor line; and forming on said second metal conductor line a passivation film comprising silicon nitride, wherein at least a part of said contact hole formed in said interlayer dielectric film has a diameter of no greater than 1 μm.

7. A method of fabricating an interconnection structure according to claim 6, wherein said film of high melting point or alloy is deposited on the top and side surfaces of said metal line by CVD in an atmosphere containing a high melting point metal compound gas.

8. A method of fabricating an interconnection structure according to claim 7, further comprising a step of heating said substrate at a temperature of 350 to 550° C. after the deposition step of said film of high melting point metal or alloy on said second metal line and before taking out said second metal conductor line into the atmospheric ambient.

* * * * *